United States Patent
Parkinson et al.

(10) Patent No.: US 9,378,975 B2
(45) Date of Patent: Jun. 28, 2016

(54) ETCHING METHOD TO FORM SPACERS HAVING MULTIPLE FILM LAYERS

(71) Applicant: Tokyo Electron Limited, Minato-ku, Tokyo (JP)

(72) Inventors: Blake Parkinson, Albany, NY (US); Alok Ranjan, Mechanicville, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/616,134

(22) Filed: Feb. 6, 2015

(65) Prior Publication Data

US 2015/0228499 A1 Aug. 13, 2015

Related U.S. Application Data

(60) Provisional application No. 61/937,942, filed on Feb. 10, 2014.

(51) Int. Cl.
| | |
|---|---|
| *H01L 21/302* | (2006.01) |
| *H01L 21/461* | (2006.01) |
| *H01L 21/311* | (2006.01) |
| *H01L 21/8234* | (2006.01) |
| *H01L 21/3065* | (2006.01) |
| *H01L 21/263* | (2006.01) |

(52) U.S. Cl.
CPC ...... *H01L 21/31116* (2013.01); *H01L 21/2633* (2013.01); *H01L 21/3065* (2013.01); *H01L 21/311* (2013.01); *H01L 21/823431* (2013.01); *H01L 21/31105* (2013.01)

(58) Field of Classification Search
None
See application file for complete search history.

(56) References Cited

U.S. PATENT DOCUMENTS

| | | | | |
|---|---|---|---|---|
| 2005/0048753 | A1* | 3/2005 | Schwan | ........ H01L 21/823864 438/595 |
| 2005/0098535 | A1* | 5/2005 | Lansford | ........... H01L 21/67253 216/59 |
| 2005/0146059 | A1 | 7/2005 | Zhong et al. | |
| 2013/0105916 | A1 | 5/2013 | Chang et al. | |
| 2013/0260561 | A1* | 10/2013 | Ranjan | ............ H01L 21/02112 438/696 |

FOREIGN PATENT DOCUMENTS

| | | |
|---|---|---|
| JP | 11-68094 A | 3/1999 |
| JP | 2010-98101 A | 4/2010 |
| JP | 2011-54718 A | 3/2011 |
| WO | 2014/013209 A1 | 1/2014 |

OTHER PUBLICATIONS

Office Action mailed Mar. 29, 2016 in corresponding Japanese Patent Application No. 2015-023284 (with an English translation) (6 pages).

* cited by examiner

*Primary Examiner* — Stephanie Duclair
(74) *Attorney, Agent, or Firm* — Rothwell, Figg, Ernst & Manbeck, P.C.

(57) ABSTRACT

Methods herein can be used for removing silicon nitride around fins and other structures without damaging underlying silicon structures. Methods herein also include forming dual layer spacers and L-shaped spacers, as well as other configurations. Techniques include a multi-step process of anisotropic etching of low-k material with high selectivity to silicon nitride, followed by isotropic etching of SiN with high selectivity to the low-k material. Such techniques, for example, can be used to form an L-shaped spacer on a 3-D gate structure, as well as providing a method for completely removing silicon nitride without damaging surrounding or underlying materials.

20 Claims, 2 Drawing Sheets

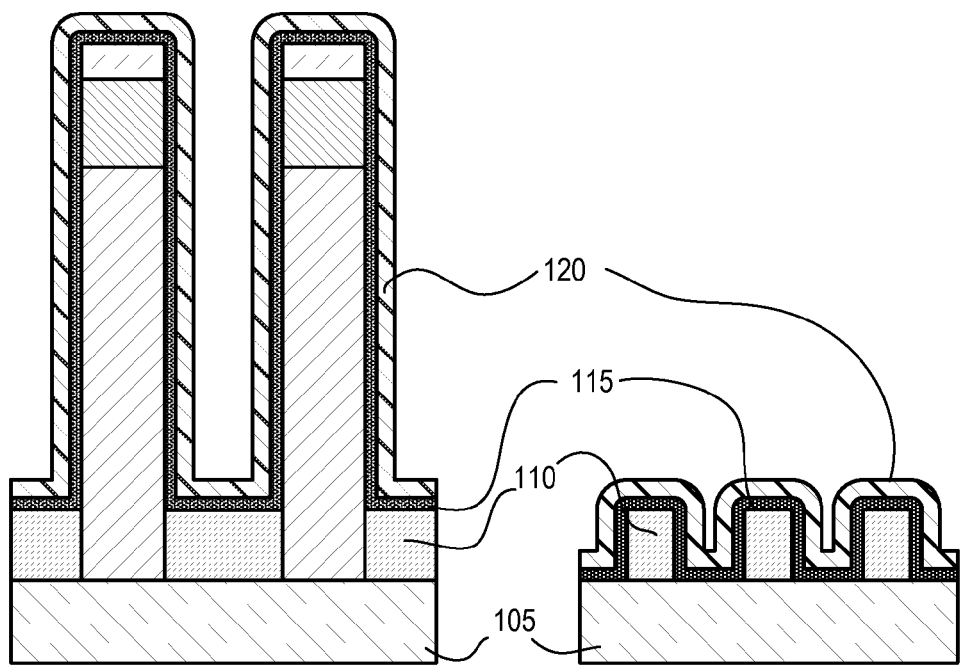
FIG. 1A  FIG. 1B
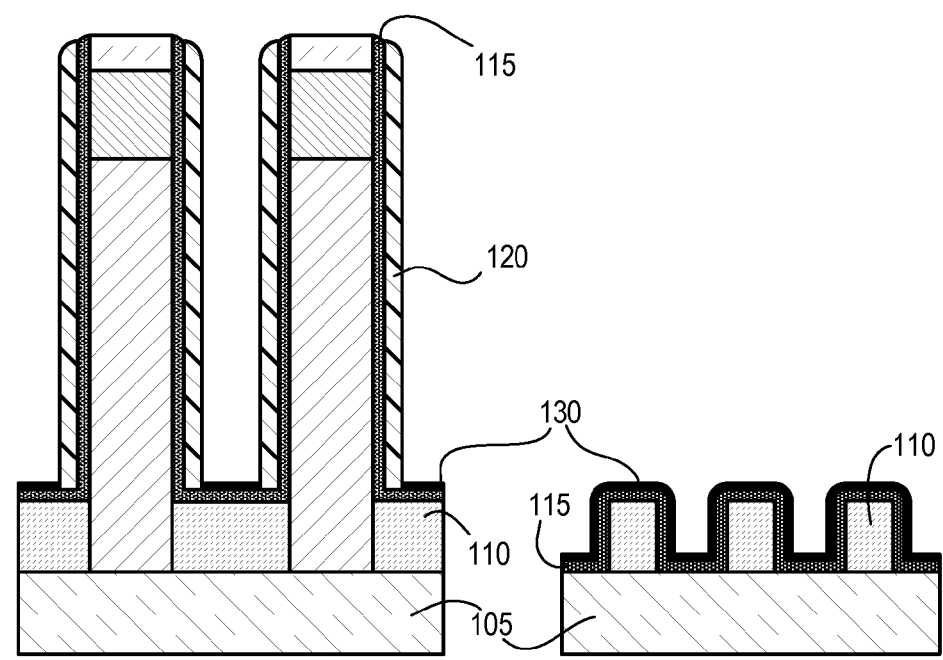
FIG. 2A  FIG. 2B

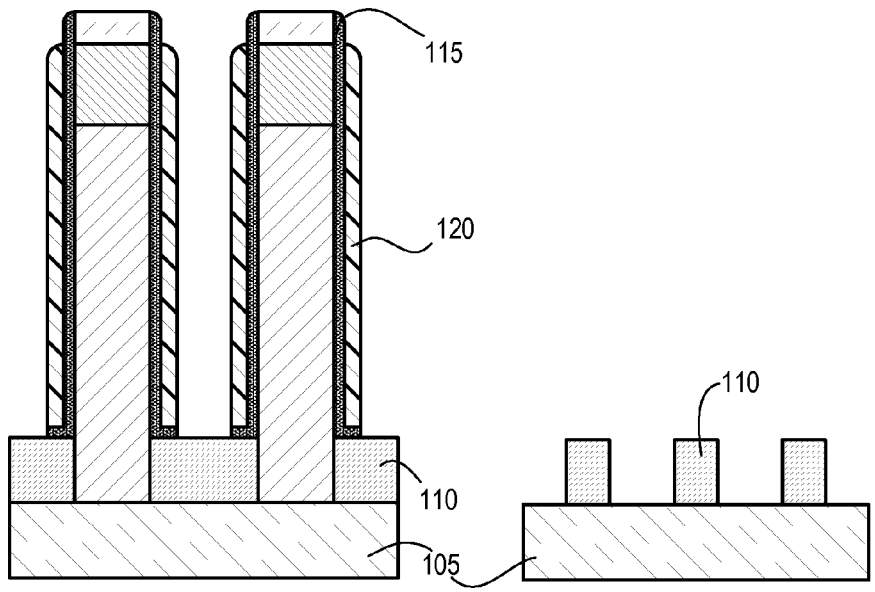
*FIG. 3A*  *FIG. 3B*
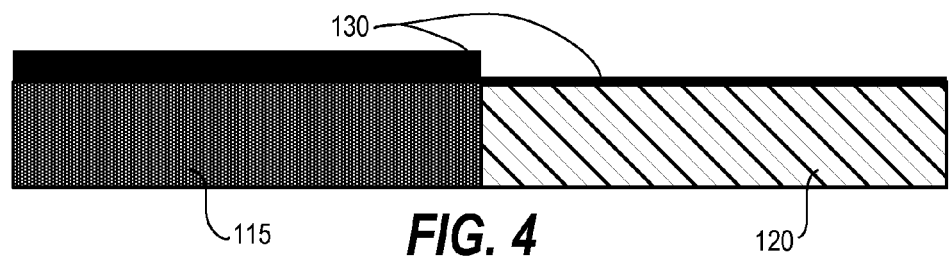
*FIG. 4*
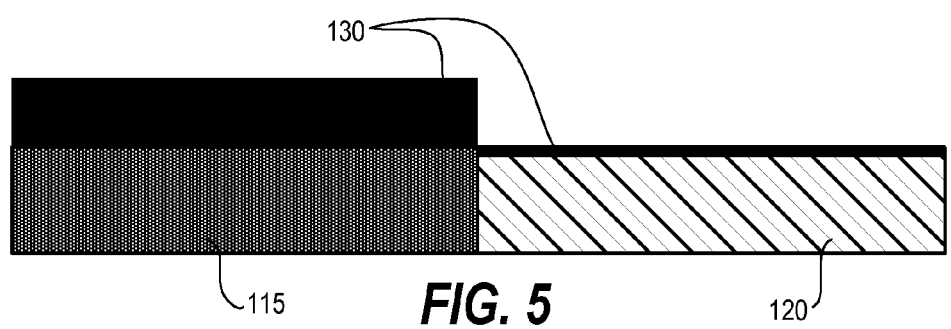
*FIG. 5*

ETCHING METHOD TO FORM SPACERS HAVING MULTIPLE FILM LAYERS

CROSS REFERENCE TO RELATED APPLICATIONS

The present application claims the benefit of U.S. Provisional Patent Application No. 61/937,942, filed on Feb. 10, 2014, entitled "Etching Method to Form Spacers Having Multiple Film Layers," which is incorporated herein by reference in its entirety.

BACKGROUND OF THE INVENTION

This disclosure relates to methods for etching features in substrates, including etching features in silicon wafers and semiconductor substrates.

The fabrication of integrated circuits (IC) in the semiconductor industry typically involves using a plasma reactor to create plasma that assists surface chemistry used to remove material from—and deposit material on—a substrate. Dry plasma etching processes are routinely used to remove or etch material along fine lines or within vias or at contacts patterned on a semiconductor substrate. A successful plasma etching process requires an etching chemistry that includes chemical reactants suitable for selectively etching one material while not etching another material or not substantially etching another material.

For example, on a semiconductor substrate, a relief pattern formed in a mask layer can be transferred to an underlying layer of a selected material using a plasma etching process. The mask layer can comprise a light-sensitive layer, such as a photoresist layer, having a pattern formed using a lithographic process. Once the relief pattern is formed, the semiconductor substrate is disposed within a plasma processing chamber, and an etching chemistry feeds a plasma such that products of the plasma selectively etch the underlying layer while minimally etching the mask layer. This etch chemistry is produced by introducing an ionizable, dissociative gas mixture having parent molecules comprising molecular constituents that react with the underlying layer while minimally reacting with the mask layer/relief pattern. Production of the etch chemistry comprises introduction of a gas mixture and formation of plasma when a portion of the gas species present are ionized following a collision with an energetic electron. Heated electrons can serve to dissociate some species of the gas mixture and create a reactive mixture of chemical constituents (of the parent molecules).

With ionized gas species and a reactive mixture of chemical constituents provided, various features (e.g., trenches, vias, contacts, etc.) can be etched in exposed regions of the semiconductor substrate. Typical materials that are etched include silicon oxide (SiOx), silicon nitride (SiNy), polycrystalline silicon (polysilicon), mono-crystalline silicon (silicon), and doped and un-doped silicon, for example.

SUMMARY

During the fabrication of a 3-D transistor gates (FinFET scheme), a SiN (silicon nitride) spacer material is conformally applied to the transistor gate and around fins, a second spacer made of low-k material can also be applied conformally to the transistor gate and around the fins on top of the SiN. Certain fabrication techniques desire to have a top of the low-k film anisotropically removed from around fins but with the low-k film left around the gate without etching the bottom layer SiN spacer (underlying silicon nitride film). The bottom layer of SiN must then be removed from around the fin without removing the low-k spacer from around the gate and without causing damage to the Si fin. This is a challenging proposition. Conventional processes typically damage the silicon fin.

Techniques disclosed herein, however, include methods for removing SiN around fins without damaging underlying silicon. Methods herein also include forming dual layer spacers and L-shaped spacers, as well as other configurations. Techniques include a multi-step process of anisotropic etching of low-k material with high selectivity to SiN, followed by isotropic etching of SiN with high selectivity to the low-k material. Such techniques, for example, can be used to form an L-shaped spacer on a 3-D gate structure, as well as providing a method for completely removing SiN without damaging surrounding or underlying materials.

One embodiment includes a method of forming a spacer. The method includes positioning a substrate on a substrate holder in a plasma processing chamber. The substrate has a silicon nitride film covering structures on the substrate as well as a low-k film covering the silicon nitride film. The silicon nitride film and the low-k film substantially conform to geometry of structures on the substrate. An anisotropic etch process is executed that etches a portion of the low-k film using plasma products from a halogen-containing process gas mixture such that the low-k film is removed from first structures while remaining on second structures that are taller than the first structures. Executing the anisotropic etch process deposits a CFy-based polymer on exposed silicon nitride surfaces. An isotropic etch process is executed that etches silicon nitride using plasma products from an oxygen-based process gas.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 1A and 1B are cross-sectional schematic views of an example substrate segment showing a process flow according to embodiments disclosed herein.

FIGS. 2A and 2B are cross-sectional schematic views of an example substrate segment showing a process flow according to embodiments disclosed herein.

FIGS. 3A and 3B are cross-sectional schematic views of an example substrate segment showing a process flow according to embodiments disclosed herein.

FIG. 4 is a schematic diagram illustrating conventional deposition.

FIG. 5 is a schematic diagram illustrating deposition and etching techniques herein.

DETAILED DESCRIPTION

Techniques disclosed herein, however, include methods for removing SiN around fins and other structures without damaging underlying silicon. Methods herein also include forming dual layer spacers and L-shaped spacers, as well as other configurations. Techniques include a multi-step process of anisotropic etching of low-k material with high selectivity to SiN, followed by isotropic etching of SiN with high selectivity to the low-k material. Such techniques, for example, can be used to form an L-shaped spacer on a 3-D gate structure, as well as providing a method for completely removing SiN without damaging surrounding or underlying materials.

Referring now to FIGS. 1A and 1B, one embodiment includes a method of forming a spacer. FIG. 1A is a cross-sectional schematic view of an example substrate segment showing a cross-section of a gate structure on a FinFET device. FIG. 1B is a cross-sectional schematic view of an example substrate segment showing a cross-section of a fin structure on a FinFET device. The method includes positioning a substrate 105 on a substrate holder in a plasma processing chamber. For example, a silicon wafer is transported into an etch chamber and secured on a chuck. The substrate has a silicon nitride film 115 covering structures on the substrate and a low-k film 120 covering the silicon nitride film 115. This can be a relatively thin layer of silicon nitride (SiN) and the low-k material that conforms (substantially) to geometry of structures on the substrate 105. Any conventional technique can be used for conformal deposition of the silicon nitride and low-k film, such as an oxide. The low-k film can be any of various low-k materials including SiO, SiOCN, SiBCN, and combinations thereof. For convenience in describing embodiments, reference will be made to specific materials. Note, however, that various additional materials can be used as well. Various different types of structures can be used with embodiments herein, but for convenience, the description herein primarily focuses on FinFET structures. Thus, the received substrate can include a FinFET structure with two conformal layers that surround the gate and fin as shown in the FIGS. 1A and 1B.

An anisotropic etch process can then be executed that etches a portion of the low-k film 120 using plasma products from a halogen-containing process gas mixture. The halogen-containing process gas mixture comprises a fluorocarbon gas such as CHF3 or other compatible gas. The anisotropic etch is controlled such that the low-k film 120 is removed from first structures 110 (typically horizontal surfaces or surfaces normal to the direction of etchants accelerated toward the substrate). The Low-k film 120 remains on second structures that are taller than the first structures 110 (typically vertical surfaces). Note in FIG. 2A that low-k film 120 has been removed from horizontal surfaces, and that in FIG. 2B low-k film has been removed from all surfaces. Executing the anisotropic etch process deposits a CFy-based polymer 130 on exposed surfaces of silicon nitride 115. This etch of low-k film 120 removes the low-k film 120 from top of gate and top of fin structures. This etch step also anisotropically removes the low-k film from the fin sidewalls via an etch chemistry with extremely high selectivity to the underlying SiN film. The selective low-k etch leaves a CFy-based polymer film 130 on top of the SiN surfaces that have been exposed. This can include top and side surfaces of fins, as shown in FIG. 2B.

A second etching step can be subsequently executed. The second etching step includes an isotropic etch process that etches silicon nitride 115 using plasma products from an oxygen-based process gas, and assisted by the CFy-based polymer film 130. For example, an oxygen-containing plasma is ignited and the oxygen and CFy polymer interact. This interaction causes the SiN film to be isotropically removed from around first structures 110 such as fin structures. The isotropic nature of this step reduces the silicon fin loss. FIGS. 3A and 3B show example results after this second etching step. The oxygen-based gas can be substantially and/or entirely oxygen. Alternatively, the isotropic etch process uses plasma products from a hydrogen-based process gas and a nitrogen-based process gas. For example, the hydrogen-based process gas can be H2, and the nitrogen-based process gas is N2.

The isotropic etch process can include continuing the isotropic etch process until silicon nitride is removed from surfaces of the first structures 110. Note that in fin structures of FIG. 3B both silicon nitride film 115 and low-k film 120 have been removed. Note also that in FIG. 3A, both silicon nitride film 115 and low-k film 120 remaining on the gate structures as sidewall spacers or sidewall structures, with silicon nitride film 115 having an L-shaped cross section. In other embodiments, the structures on the substrate include FinFET (Fin-Field Effect Transistor) structures with the first structures 110 including fins of a FinFET, and with the second structures including a gate of the FinFET.

Another embodiment includes a method of forming a spacer. The method includes positioning a substrate on a substrate holder in a plasma processing chamber. The substrate has a first film of a first material covering structures on the substrate and a second film of a second material covering the first film. The first film and the second film conform to geometry of structures on the substrate. An anisotropic etch process is executed that etches a portion of the second film using plasma products from a halogen-containing process gas mixture such that the second material is removed from first structures while remaining on second structures that are taller than the first structures. The anisotropic etch process can deposit a polymer on exposed first film surfaces. Alternatively, a separate or alternating process can be a deposition step that deposits a reactive polymer on exposed surfaces of the first material. An isotropic etch process can then be executed that etches the first material using plasma products.

In example embodiments herein, SiN selectivity can be improved from a conventional selectivity ratio of 2.7:1, to essentially perfect selectivity. Argon flow, CHF3 flow, and center/edge temperature can be adjusted to maximize selectivity. In one example process, an anisotropic etch can be run with the following plasma processing conditions: pressure at 20 mT, power at 1200 MW, magnetic flux of 80 Wb, chemistry flow rates of 500 sccm Argon/70 sccm CHF3/30 sccm H2. Discoveries herein include that using an O2 plasma can not only remove polymer films, but can also simultaneously remove underlying silicon nitride films.

In a conventional process, a thin CFy-based polymer film 130 can be formed over silicon nitride film 115, as shown in FIG. 4. SiO (or other low-k material) is removed by CFy polymer (such as via CO, CO2, SiFx byproducts). Some silicon nitride can be removed by etchants (such as H-based etchants) diffusing through the polymer layer during the anisotropic etch (HCN byproduct and SiF). With techniques herein, however, the CFy-based polymer film on the SiN is thickened preventing these etchants from reaching the SiN surface, which significantly reduces the etch rate. This can reduce the oxide etch rate, but prevent undesirable etching of unexposed silicon nitride 115. FIG. 5 illustrates the CFy-based polymer 130 deposited herein.

One advantage of this technique is to prevent etching of SiN on gate sidewalls. After completing an oxide etching process, an isotropic oxygen-based plasma removes exposed silicon nitride surfaces, that is, surfaces not protected by or covered by an oxide/low-k film. In alternative embodiments, a combination of nitrogen and hydrogen (N2/H2) gasses are used instead of the oxygen as a basis for the plasma to remove exposed SiN surfaces.

In another alternative embodiment, a reactive polymer layer is deposited in a deposition step after the anisotropic etch process. For example, in one process flow an anisotropic etch is executed that etches a portion of the low-k film using plasma products from a halogen-containing process gas mixture. This is followed by executing a deposition process that deposits a reactive polymer layer, such as a CFy-based polymer layer. This reactive polymer layer can be deposited on exposed silicon nitride surfaces. Then an isotropic etch process is executed that etches silicon nitride using plasma products from an oxygen-based process gas (or, alternatively, an N2 and H2 based process gas).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming a spacer, the method comprising:
    positioning a substrate on a substrate holder in a plasma processing chamber, the substrate having a silicon nitride film covering structures on the substrate and a low-k film covering the silicon nitride film, the silicon nitride film and the low-k film substantially conforming to geometry of structures on the substrate;
    executing an anisotropic etch process that etches a portion of the low-k film using plasma products from a halogen-containing process gas mixture such that the low-k film is removed from first structures while remaining on second structures that are taller than the first structures, executing the anisotropic etch process deposits a CFy-based polymer on exposed silicon nitride surfaces; and
    executing an isotropic etch process that etches silicon nitride using plasma products from an oxygen-based process gas.

2. The method of claim 1, wherein the structures on the substrate include FinFET (Fin-Field Effect Transistor) structures.

3. The method of claim 2, wherein the first structures includes fins of a FinFET, and wherein the second structures include a gate of the FinFET.

4. The method of claim 1, wherein the low-k film is selected from the group consisting of SiO, SiOCN, and SiBCN.

5. The method of claim 1, wherein the halogen-containing process gas mixture comprises a fluorocarbon gas.

6. The method of claim 5, wherein the fluorocarbon gas is CHF3.

7. The method of claim 1, wherein the oxygen-based process gas is substantially entirely oxygen.

8. The method of claim 1, wherein executing the isotropic etch process includes continuing the isotropic etch process until silicon nitride is removed from surfaces of the first structures.

9. A method of forming a spacer, the method comprising:
    positioning a substrate on a substrate holder in a plasma processing chamber, the substrate having a silicon nitride film covering structures on the substrate and a low-k film covering the silicon nitride film, the silicon nitride film and the low-k film substantially conforming to geometry of structures on the substrate;
    executing an anisotropic etch process that etches a portion of the low-k film using plasma products from a halogen-containing process gas mixture such that the low-k film is removed from a portion of surfaces of the structures while remaining on other surfaces of the structures such that a first portion of the silicon nitride film remains covered with the low-k film while a second portion of the silicon nitride film has exposed surfaces, executing the anisotropic etch process deposits a CFy-based polymer on exposed silicon nitride surfaces; and
    executing an isotropic etch process that etches silicon nitride using plasma products from an oxygen-based process gas.

10. The method of claim 9, wherein the low-k film is selected from the group consisting of SiO, SiOCN, and SiBCN.

11. The method of claim 9, wherein the halogen-containing process gas mixture comprises a fluorocarbon gas.

12. The method of claim 11, wherein the fluorocarbon gas is CHF3.

13. The method of claim 9, wherein the oxygen-based process gas is substantially entirely oxygen.

14. The method of claim 9, wherein executing the isotropic etch process includes maintaining the isotropic etch process until silicon nitride is removed from exposed surfaces of the silicon nitride film.

15. A method of forming a spacer, the method comprising:
positioning a substrate on a substrate holder in a plasma processing chamber, the substrate having a first film of a first material covering structures on the substrate and a low-k film covering the first film, the first film and the low-k film conforming to geometry of structures on the substrate;
executing an anisotropic etch process that etches a portion of the low-k film using plasma products from a halogen-containing process gas mixture such that the low-k film is removed from first structures while remaining on second structures that are taller than the first structures, executing the anisotropic etch process deposits a CFy-based polymer on exposed first film surfaces; and
executing an isotropic etch process that etches the first material using plasma products.

16. The method of claim 15, wherein the isotropic etch process uses plasma products from an oxygen-based process gas.

17. The method of claim 15, wherein the isotropic etch process uses plasma products from a hydrogen-based process gas and a nitrogen-based process gas.

18. The method of claim 17, wherein the hydrogen-based process gas is H2, and wherein the nitrogen-based process gas is N2.

19. The method of claim 15, wherein the first film is a silicon nitride film.

20. The method of claim 19, wherein the halogen-containing process gas mixture comprises a fluorocarbon gas.

* * * * *